United States Patent
Zhan et al.

(10) Patent No.: US 8,643,013 B2
(45) Date of Patent: Feb. 4, 2014

(54) FLAT PANEL DISPLAY DEVICE INCLUDING A STORAGE CAPACITOR

(75) Inventors: Zhi-Feng Zhan, Yongin (KR);
Seung-Gyu Tae, Yongin (KR);
Deok-Hoi Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 190 days.

(21) Appl. No.: 13/029,636

(22) Filed: Feb. 17, 2011

(65) Prior Publication Data
US 2011/0297941 A1   Dec. 8, 2011

(30) Foreign Application Priority Data

Jun. 7, 2010   (KR) .................. 10-2010-0053597

(51) Int. Cl.
*H01L 33/08*   (2010.01)
*H01L 33/16*   (2010.01)

(52) U.S. Cl.
USPC .................. 257/59; 257/72; 257/E33.003

(58) Field of Classification Search
USPC .............. 257/59, 72, E33.053, E33.003, 257/E33.004, 83, 84, 88, 184, 187, 257, 257/258
See application file for complete search history.

(56) References Cited

U.S. PATENT DOCUMENTS

| | | | |
|---|---|---|---|
| 2005/0104814 A1* | 5/2005 | Choi et al. | 345/76 |
| 2005/0121677 A1* | 6/2005 | Kim et al. | 257/72 |
| 2007/0103610 A1* | 5/2007 | Lee et al. | 349/38 |
| 2008/0303776 A1* | 12/2008 | Jung | 345/100 |
| 2010/0072478 A1 | 3/2010 | Koo et al. | |

FOREIGN PATENT DOCUMENTS

| | | |
|---|---|---|
| KR | 10-2005-0051140 A | 6/2005 |
| KR | 10-2005-0111171 A | 11/2005 |
| KR | 10-2006-0123004 A | 12/2006 |

* cited by examiner

*Primary Examiner* — Selim Ahmed
(74) *Attorney, Agent, or Firm* — Christie, Parker & Hale, LLP

(57) ABSTRACT

A flat panel display device having increased capacitance and a method of manufacturing the flat panel display device are provided. A flat panel display device includes: a plurality of pixel areas, each located at a crossing region of a gate line, a data line, and a common voltage line; a thin film transistor (TFT) located at a region where the gate line and the data line cross each other, the TFT including a gate electrode, a source electrode, and a drain electrode; and a storage capacitor located at a region where the common voltage line and the drain electrode cross each other, the storage capacitor including first, second, and a third storage electrodes.

13 Claims, 8 Drawing Sheets

FLAT PANEL DISPLAY DEVICE INCLUDING A STORAGE CAPACITOR

CROSS-REFERENCE TO RELATED PATENT APPLICATION

This application claims priority to and the benefit of Korean Patent Application No. 10-2010-0053597, filed on Jun. 7, 2010 in the Korean Intellectual Property Office, the disclosure of which is incorporated herein in its entirety by reference.

BACKGROUND

1. Field

Embodiments of the present invention relate to a flat panel display device and a method of manufacturing the same.

2. Description of the Related Art

In general, in flat panel display devices, an active layer used to form a thin film transistor is extended to a storage capacitor and thus is used as a lower electrode of the storage capacitor.

In this case, static electricity may be charged between an upper electrode and the lower electrode of the storage capacitor due to a protrusion of polysilicon used to form the active layer. Also, polysilicon used to form the active layer has low conductivity so that an area of the lower electrode of the active layer may increase in order to secure or obtain a desired capacitance.

SUMMARY

Embodiments of the present invention provide a flat panel display device with increased capacitance by arranging a storage capacitor in parallel through a first storage electrode located at a same level as a gate electrode, a second storage electrode from which a common voltage line is extended, and a third storage electrode from which a drain electrode is extended, and a method of manufacturing the flat panel display device.

According to an aspect of an embodiment of the present invention, a flat panel display device includes: a plurality of pixel areas, each located at a crossing region of a gate line, a data line, and a common voltage line; a thin film transistor (TFT) located at a region where the gate line and the data line cross each other, the TFT including a gate electrode, a source electrode, and a drain electrode; and a storage capacitor located at a region where the common voltage line and the drain electrode cross each other, the storage capacitor including a first storage electrode, a second storage electrode, and a third storage electrode.

The first storage electrode may be located at a same level as the gate electrode, the second storage electrode may extend from the common voltage line and partially overlap the first storage electrode, and the third storage electrode may extend from the drain electrode and overlap the first storage electrode and the second storage electrode.

The TFT may further include: an active layer located on a substrate; an insulating layer located on the active layer; and a plurality of interlayer adjusting layers located on the gate electrode, wherein the gate electrode is located on the insulating layer, wherein the source electrode is integrally formed with the data line, and the source electrode contacts the active layer through the interlayer adjusting layers and the insulating layer, and wherein the third storage electrode contacts the active layer through the interlayer adjusting layers and the insulating layer.

The storage capacitor may further include: an insulating layer located on a substrate; a first interlayer adjusting layer located on the first storage electrode; and a second interlayer adjusting layer located on the second storage electrode, wherein the first storage electrode is located on the insulating layer, wherein the second storage electrode is located on the first interlayer adjusting layer and extends from the common voltage line, and wherein the third storage electrode is located on the second interlayer adjusting layer, contacts the first storage electrode through the first interlayer adjusting layer and the second interlayer adjusting layer, and extends from the drain electrode.

The second storage electrode includes a plurality of second storage electrodes.

The device may further include: a protection layer located on the third storage electrode; and a pixel electrode located on the protection layer and contacting the third storage electrode by penetrating the protection layer.

The device may further include: a first contact hole to expose the first storage electrode through the first interlayer adjusting layer and the second interlayer adjusting layer at a region where the second storage electrode is not located; and a second contact hole to expose the third storage electrode through the protection layer at a region where the first storage electrode or the third storage electrode is located.

The first contact hole and the second contact hole may overlap each other.

The first interlayer adjusting layer and the second interlayer adjusting layer may include at least one selected from the group consisting of silicon nitride and silicon oxide.

The second interlayer adjusting layer may include a material having higher permittivity than that of the first interlayer adjusting layer.

The second interlayer adjusting layer may include silicon nitride.

The second storage electrode may include a metal or indium tin oxide (ITO).

The flat panel display device may be a liquid crystal display device.

According to an aspect of another embodiment of the present invention, a method of manufacturing a flat panel display device includes: preparing a substrate on which pixel areas are defined, the pixel areas including a thin film transistor (TFT) area and a storage capacitor area; forming an active layer on the TFT area of the substrate; forming a gate line extending in a first direction on the substrate, a gate electrode located in the TFT area, and a first storage electrode in the storage capacitor area; forming a common voltage line in a direction parallel to the gate line along with a second storage electrode in the storage capacitor area extending from the common voltage line; forming a data line and a source electrode in a second direction to cross with the gate line; and forming a drain electrode in the TFT area along with a third storage electrode in the storage capacitor area extending from the drain electrode.

The method may further include: forming a first interlayer adjusting layer covering the first storage electrode; forming a second interlayer adjusting layer covering the second storage electrode; forming a first contact hole to expose the first storage electrode through the first interlayer adjusting layer and the second interlayer adjusting layer at a region where the second storage electrode is not located.

The method may further include: forming a protection layer to cover the third storage electrode; and forming a second contact hole to expose the third storage electrode through the protection layer at a region where the first storage electrode or the third storage electrode is located.

The first contact hole and the second contact hole may overlap each other.

The first interlayer adjusting layer and the second interlayer adjusting layer may include at least one selected from the group consisting of silicon nitride and silicon oxide.

The second interlayer adjusting layer may include a material having higher permittivity than that of the first interlayer adjusting layer.

The second interlayer adjusting layer may include silicon nitride.

The second storage electrode may include a metal or indium tin oxide (ITO).

The flat panel display device may be a liquid crystal display device.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
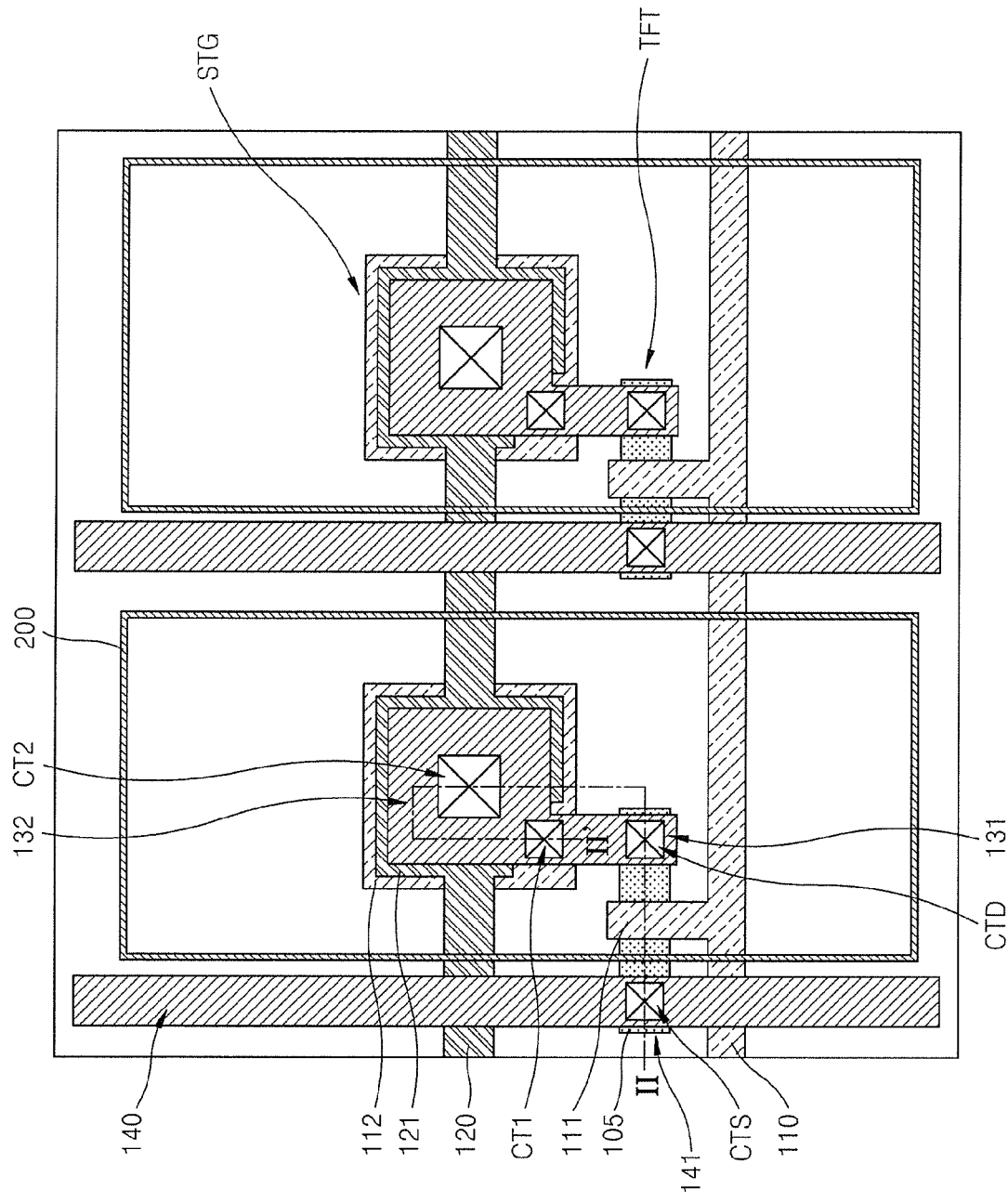
FIG. 1 is a plan view schematically illustrating a flat panel display device according to an embodiment of the present invention.

While exemplary embodiments are capable of various modifications and alternative forms, embodiments thereof are shown by way of exemplary in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. In the description, the detailed descriptions of well-known technologies and structures may be omitted so as not to hinder the understanding of the present invention.

It will be understood that, although the terms first, second, third, etc., may be used herein to describe various elements, these elements should not be limited by these terms. These terms are only used to distinguish one element from another element.

The terminology used herein is for the purpose of describing particular embodiments only and is not intended to be limiting of exemplary embodiments. As used herein, the singular forms are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described more fully with reference to the accompanying drawings.

FIG. 1 is a plan view schematically illustrating a flat panel display device according to an embodiment of the present invention.

The flat panel display device according to embodiments of the present invention may be an organic light-emitting display apparatus or a liquid crystal display apparatus. Hereinafter, it will be assumed that the flat panel display device is a liquid crystal display apparatus.

Referring to FIG. 1, the flat panel display device includes a gate line 110, a data line 140, and a common voltage line 120, wherein the gate line 110, the data line 140, and the common voltage line 120 cross each other and define pixel areas. Each of the pixel areas may include a thin film transistor (TFT) area and a storage capacitor (STG) area.

In one embodiment, the TFT is formed (or located) where the gate line 110 and the data line 140 cross each other and includes a gate electrode 111, a source electrode 141, and a drain electrode 131. The common voltage line 120 is spaced apart from and parallel with the gate line 110. The STG is located (or formed) where the common voltage line 120 and the extended drain electrode 131 cross each other and includes a first storage electrode 112, a second storage electrode 121, and a third storage electrode 132.

The TFT includes the gate electrode 111, the source electrode 141, and the drain electrode 131, wherein the gate electrode 111 extends in a second direction from the gate line 110 arranged in a first direction, the source electrode 141 is a part of the data line 140 arranged in the second direction, and the drain electrode 131 is spaced apart from the source electrode 141 by an interval (e.g., a predetermined interval). The gate electrode 111, the source electrode 141, and the drain electrode 131 are located on an active layer 105. The source electrode 141 and the drain electrode 131 are spaced apart from the gate electrode 111 by an interval (e.g., a predetermined interval). However, embodiments of the present invention are not limited thereto and the source electrode 141 and the drain electrode 131 may both partially overlap an upper end of the gate electrode 111. When an insulating layer is located on the active layer 105, the gate electrode 111 is located on the insulating layer, and a plurality of interlayer adjusting layers are located on the gate electrode 111, a source electrode contact hole (or source electrode contact opening) (CTS) and a drain electrode contact hole (or drain electrode contact opening) (CTD) may pass through (or penetrate) the insulating layer and the interlayer adjusting layers. The source electrode 141 and the drain electrode 131 may be located in the CTS and the CTD, respectively, so as to contact the active layer 105 at a bottom of the CTS and the CTD. According to an embodiment of the present invention, the drain electrode 131 extends into the STG area, which is separated from the TFT, and may constitute the third storage electrode 132 of the STG.

In one embodiment of the present invention, the STG is separated from the TFT and includes the first, second, and third storage electrodes 112, 121, and 132. The first storage electrode 112 of the STG is located at the same level as the gate electrode 111. The second storage electrode 121 is formed in such a way that the common voltage line 120 extends from the second storage electrode 121, and partially overlaps with the first storage electrode 112. The third storage electrode 132 is formed in such a way that the drain electrode 131 extends from the third storage electrode 132, and partially overlaps with the first storage electrode 112 and the second storage electrode 121. Here, the first, second, and third storage electrodes 112, 121, and 132 each have an area (e.g., a predetermined area) and thereby, their capacitances are determined. The STG includes a first storage capacitor (STG1 in FIG. 3) including the first storage electrode 112, the second storage electrode 121, and a first interlayer adjusting layer 103 interposed between the first storage electrode 112 and the second storage electrode 121. Also, the STG includes a second storage capacitor (STG2 in FIG. 3) including the second storage electrode 121, the third storage electrode 132, and a second interlayer adjusting layer 104 interposed between the second storage electrode 121 and the third storage electrode 132. Accordingly, the STG (or storage capacitor) according to an embodiment of the present invention includes the first storage capacitor STG1 and the second storage capacitor STG2 that are arranged in parallel with each other, and total capacitance of the STG is obtained by adding the capacitance of the first storage capacitor STG1 and the capacitance of the second storage capacitor STG2.

Figure 2:
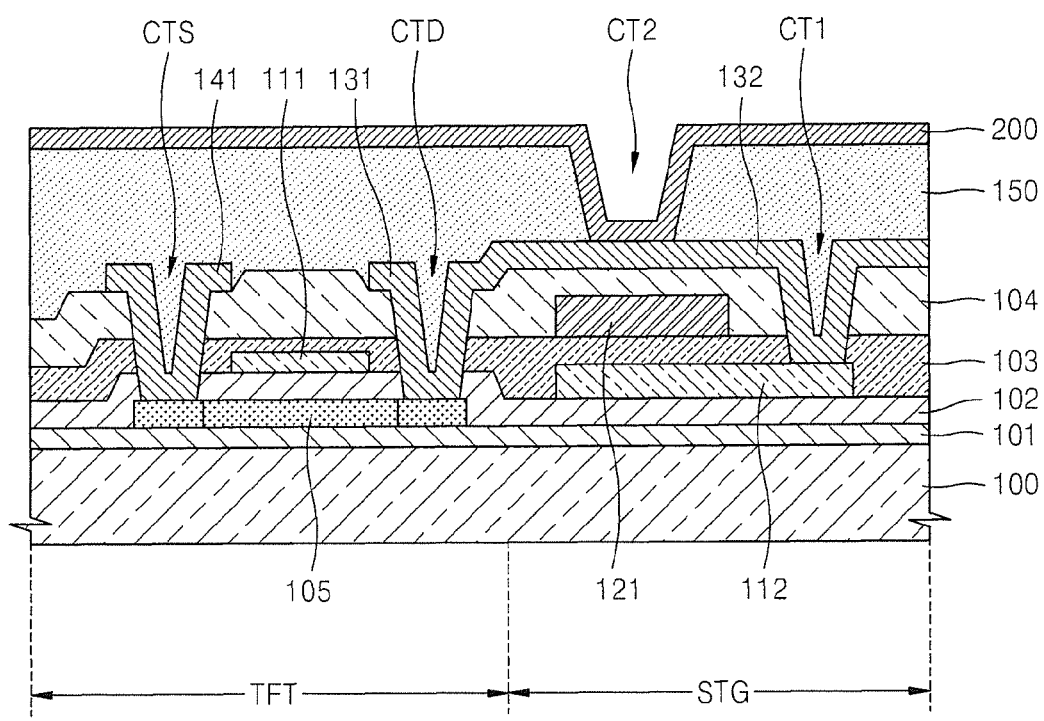
FIG. 2 is a cross-sectional view taken along a line II-II of FIG. 1.

FIG. 2 is a cross-sectional view taken along a line II-II' of FIG. 1. For convenience of description, the TFT and the STG are distinguished from each other.

Referring to FIG. 2, in one embodiment of the present invention, the TFT includes the active layer 105 located on a substrate 100, an insulating layer 102 located on the active layer 105, the gate electrode 111 located on the insulating layer 102, the first interlayer adjusting layer 103 located on the gate electrode 111, and the second interlayer adjusting layer 104 located on the first interlayer adjusting layer 103. Also, the source electrode 141 contacts the active layer 105 through the source electrode contact hole CTS in the first and second interlayer adjusting layers 103 and 104 and the insulating layer 102 and is integrally formed with the data line 140 as a single body, as illustrated in FIG. 1. Also, the drain electrode 131 contacts the active layer 105 through the drain electrode contact hole CTD in the first and second interlayer adjusting layers 103 and 104 and the insulating layer 102 and extends into the STG area to form the third storage electrode 132, as illustrated in FIG. 1 and FIG. 2.

The STG includes the insulating layer 102 located on the substrate 100, the first storage electrode 112 located on the insulating layer 102, the first interlayer adjusting layer 103 located on the first storage electrode 112, and the second storage electrode 121 located on the first interlayer adjusting layer 103 and formed in such a way that the common voltage line 120 extends from the STG. Also, the STG includes the second interlayer adjusting layer 104 located on the second storage electrode 121. The third storage electrode 132 is located on the second interlayer adjusting layer 104 and contacts the first storage electrode 112 through a first contact hole (or first contact unit or opening) CT1 located in the first interlayer adjusting layer 103 and second interlayer adjusting layer 104. As described above, the third storage electrode 132 extends from the drain electrode 131 of the TFT.

A protection layer 150 is located on uppermost surfaces of the TFT and the STG, and a pixel electrode 200 may be located on the protection layer 150. Here, a second contact hole (or second contact unit or opening) CT2 may be formed by penetrating (or through) the protection layer 150 located on the third storage electrode 132, and a part of the pixel electrode 200 may contact the third storage electrode 132 through the second contact hole CT2.

Referring to FIGS. 1 and 2, the first contact hole CT1 may be formed by penetrating (or through) the first and second interlayer adjusting layers 103 and 104 at locations corresponding to a part (or a location) where the second storage electrode 121 is not located. Also, the second contact hole CT2 may be formed by penetrating (or through) the protection layer 150 to correspond to a part where the third storage electrode 132 or the first storage electrode 112 is located. The locations of the first and second contact holes CT1 and CT2 and arrangement and number of the second storage electrode 121 in reference to the location of the first and second contact holes CT1 and CT2 in accordance with embodiments of the present invention will be described in more detail later with reference to FIGS. 12 through 14.

Figure 3:
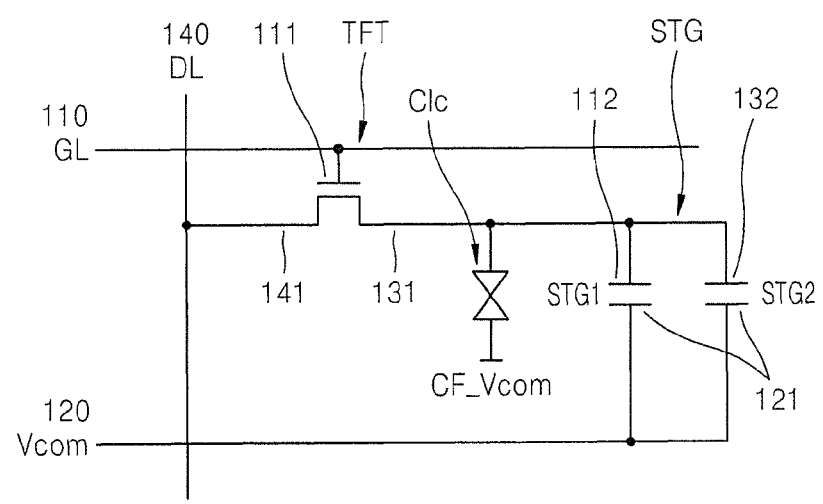
FIG. 3 is a circuit diagram of a pixel of the flat panel display device of FIGS. 1 and 2 according to an embodiment of the present invention.

FIG. 3 is a circuit diagram of a pixel of the flat panel display device of FIGS. 1 and 2, according to an embodiment of the present invention.

Each of the pixels included in the flat panel display device includes a thin film transistor (TFT), a storage capacitor (STG), and a liquid crystal capacitor (Clc). The gate terminal 111 of the TFT is electrically coupled to the gate line GL 110 and receives a gate signal. The source terminal 141 of the TFT is electrically coupled to the data line DL 140 and receives a data signal. The drain terminal 131 is coupled to one terminal of the STG and one terminal of the Clc. The other terminal of the Clc is coupled to a color filter common electrode voltage CF_Vcom and the other terminal of the STG is coupled to the common voltage line Vcom 120. The STG according to an embodiment of the present invention includes the first storage capacitor STG1 and the second storage capacitor STG2 that are arranged in parallel with each other. More specifically, the first storage capacitor STG1 includes the first storage electrode 112 and the second storage electrode 121, and the second storage capacitor STG2 includes the second storage electrode 121 and the third storage electrode 132. Accordingly, the storage capacitor according to an embodiment of the present invention may have a greater capacitance than that of typical capacitors having the same area and structure due to the parallel structure.

An increase in the capacitance of the STG according to an embodiment of the present invention is now calculated, in comparison with a capacitor (hereinafter, referred to as a typical capacitor) only including the first interlayer adjusting layer 103 interposed between the first storage electrode 112 and the second storage electrode 121. Here, a permittivity and a thickness of the first interlayer adjusting layer 103 are $\epsilon 1$ and $d1$, respectively, and a permittivity and a thickness of the second interlayer adjusting layer 104 are $\epsilon 2$ and $d2$, respectively.

Capacitance Cst of the typical capacitor is represented by Equation 1 below.

$$Cst = \varepsilon 1 \times \frac{S}{d1} \qquad \text{Equation 1}$$

wherein S is an area of the typical capacitor.

Capacitance Cst1 of the first STG STG1 according to an embodiment of the present invention is also represented by Equation 1 since the first STG STG1 only includes the first interlayer adjusting layer 103 interposed between the first storage electrode 112 and the second storage electrode 121.

Capacitance Cst2 of the second STG STG2 according to an embodiment of the present invention is represented by Equation 2 below since the second STG STG2 includes the second interlayer adjusting layer 104 interposed between the second storage electrode 121 and the third storage electrode 132.

$$Cst2 = \varepsilon 2 \times \frac{S}{d2} \qquad \text{Equation 2}$$

Accordingly, a ratio of the capacitance of the STG according to an embodiment of the present invention to the capacitance of the typical capacitor is (Cst1+Cst2)/Cst=(Cst+Cst2)/Cst=1+(Cst2/Cst).

Experimentally, when the first interlayer adjusting layer 103 is formed of silicon oxide/silicon nitride ($SiO_2$/SiNx) having a thickness of about 400 Å/400 Å and the second interlayer adjusting layer 104 is formed of SiNx having a thickness of about 6000 Å, Cst2/Cst is about 0.18. That is, the STG according to an embodiment of the present invention has a capacitance about 18% greater than that of the typical capacitor having the same area. In other words, if the STG of the present invention is designed to have the same capacitance as the typical capacitor, the STG may have an area of about 84% the size of the typical capacitor (based on 1/1.18=0.84). Therefore, if the area occupied by a typical capacitor in the entire pixel is about 12% and the STG according to an embodiment is used in place of the typical capacitor, the aperture ratio of the pixel will be increased by about 2%.

FIGS. 4 through 11 are cross-sectional views illustrating a method of manufacturing a flat panel display device according to an embodiment of the present invention.

Figure 4:
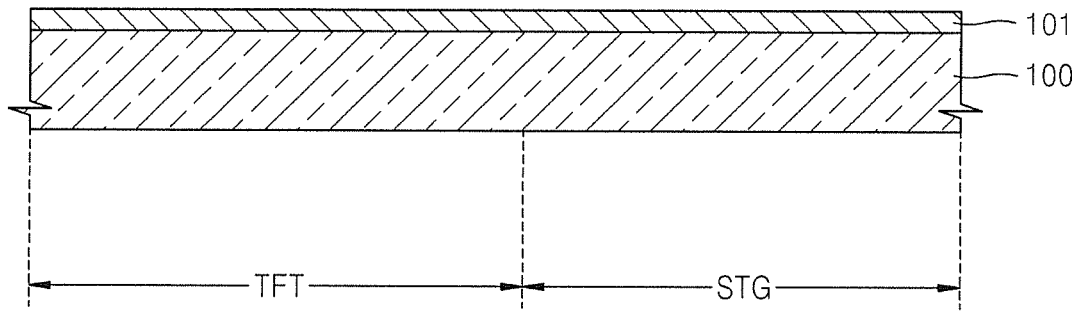
FIGS. 4 through 11 are cross-sectional views illustrating a method of manufacturing a flat panel display device, according to an embodiment of the present invention.

Referring to FIG. 4, a plurality of pixel areas may be defined in the substrate 100. For convenience of description, the pixel areas include TFT areas where TFTs are located and STG areas where STGs are located. As illustrated in FIG. 4, a barrier layer and/or the buffer layer 101 may be located on the substrate 100 for preventing impurity ions from diffusing and moisture or air from penetrating and planarizing the surface.

Figure 5:
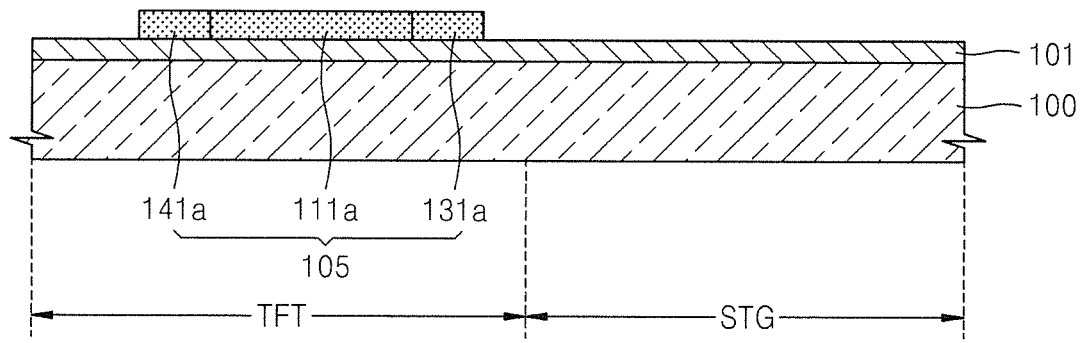

Referring to FIG. 5, the active layer 105 of the TFT is located on the buffer layer 101 with a semiconductor material and the insulating layer 102 (see, e.g., FIG. 6) is located to cover the active layer 105. The active layer 105 may be formed of an inorganic semiconductor material, such as amorphous silicon or polysilicon, or an organic semiconductor material and may include a source area 141a, a drain area 131a, and a channel area 111a interposed between the source area 141a and the drain area 131a. According to an embodiment of the present invention, the active layer 105 does not extend into the STG area and is only located in the TFT area.

Figure 6:
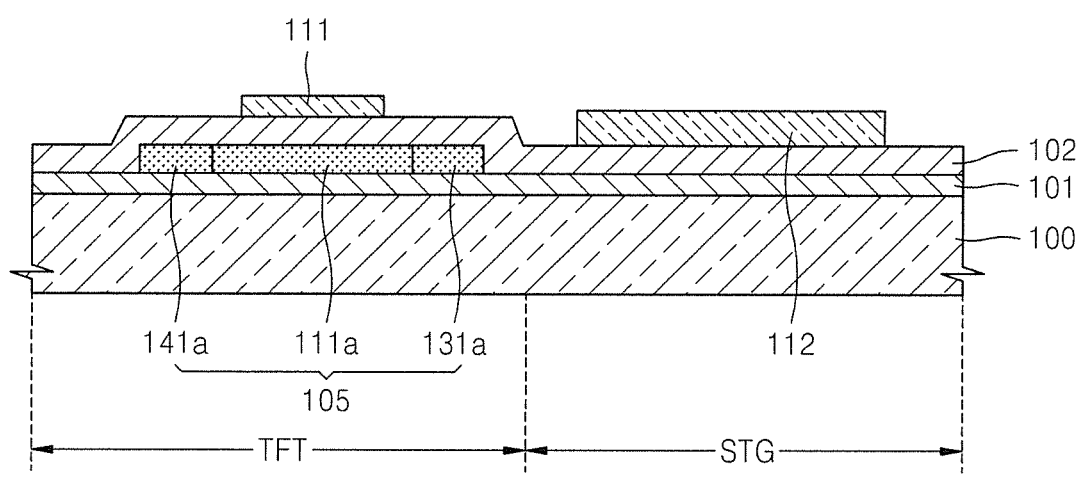

Referring to FIG. 6, the gate electrode 111 is located on the insulating layer 102, at the TFT area. The first storage electrode 112 formed of the same material as the gate electrode 111 is located on the insulating layer 102 at the STG area. The gate electrode 111 extends from the gate line 110 and the gate line 110 is located on the substrate 100 extending in a first direction as shown in FIG. 1.

Figure 7:
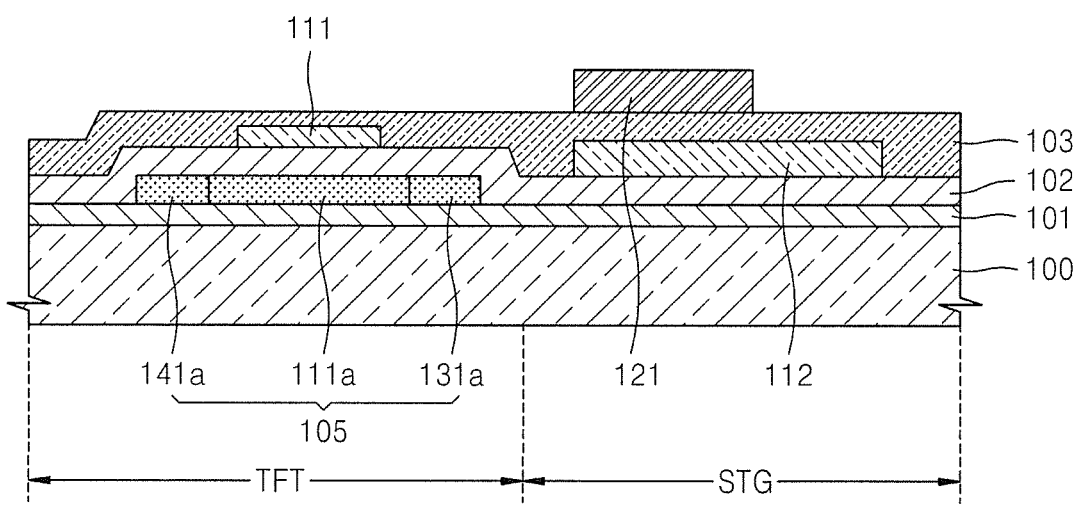

Referring to FIG. 7, the first interlayer adjusting layer 103 covers the gate electrode 111 and the first storage electrode 112. Then, the second storage electrode 121 is located on the first interlayer adjusting layer 103, at the STG area. Here, the second storage electrode 121 partially overlaps (or overlaps a portion of) the first storage electrode 112. Referring to FIG. 1, the second storage electrode 121 does not cover the entire first storage electrode 112 and instead, is not located in areas where the first contact hole CT1 will be located. The second storage electrode 121 extends from the common voltage line 120 and the common voltage line 120 is also located to be parallel with the gate line 110 as shown in FIG. 1. According to an embodiment of the present invention, the second storage electrode 121 may be formed of a metal or indium tin oxide (ITO). If the second storage electrode 121 is formed of a metal, electrical conductivity thereof is great and thus a common electrode signal applied through the common voltage line 120 may be prevented from being delayed. If the second storage electrode 121 is formed of ITO, an aperture ratio thereof is increased and may be excellent.

Figure 8:
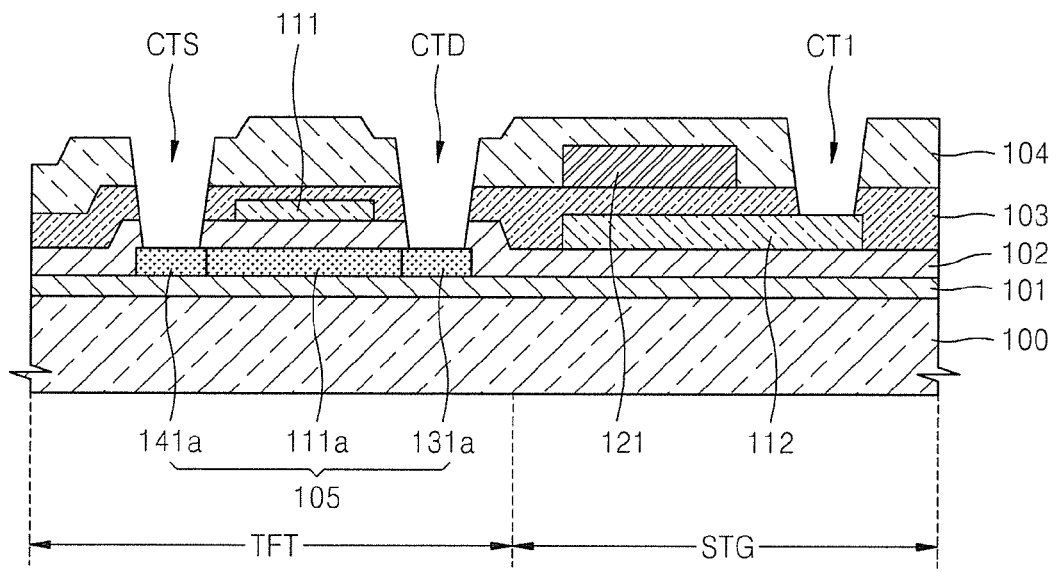

Referring to FIG. 8, the second interlayer adjusting layer 104 further covers the second storage electrode 121. In the TFT area, the source electrode contact hole (CTS) and the drain electrode contact hole (CTD) are formed in (or through) the first interlayer adjusting layer 103, the second interlayer adjusting layer 104, and the insulating layer 102. In the STG area, the first contact hole CT1 is located in the first interlayer adjusting layer 103 and the second interlayer adjusting layer 104 to correspond to a part (or location) where the second storage electrode 121 is not located. As shown in FIG. 8, the first contact hole CT1 is located at a right side of the second storage electrode 121. However, embodiments of the present invention are not limited thereto and the first contact hole CT1 may be located at a left side, which will be described later.

The insulating layer 102, the first interlayer adjusting layer 103, and the second interlayer adjusting layer 104 may each be an insulator, may each have a single-layered or a multi-layered structure, and may each be formed of an organic material, an inorganic material, or an organic/inorganic composition.

According to an embodiment of the present invention, the first interlayer adjusting layer 103 and the second interlayer adjusting layer 104 may include at least one selected from the group consisting of silicon nitride (SiNx) and silicon oxide (SiOx). In particular, the second interlayer adjusting layer 104 may be formed of a material having higher permittivity than that of the first interlayer adjusting layer 103. Accordingly, the first interlayer adjusting layer 103 may be formed of silicon oxide (SiOx) and the second interlayer adjusting layer 104 may be formed of silicon nitride (SiNx) having (or which has) higher permittivity than that of silicon oxide (SiOx).

Figure 9:
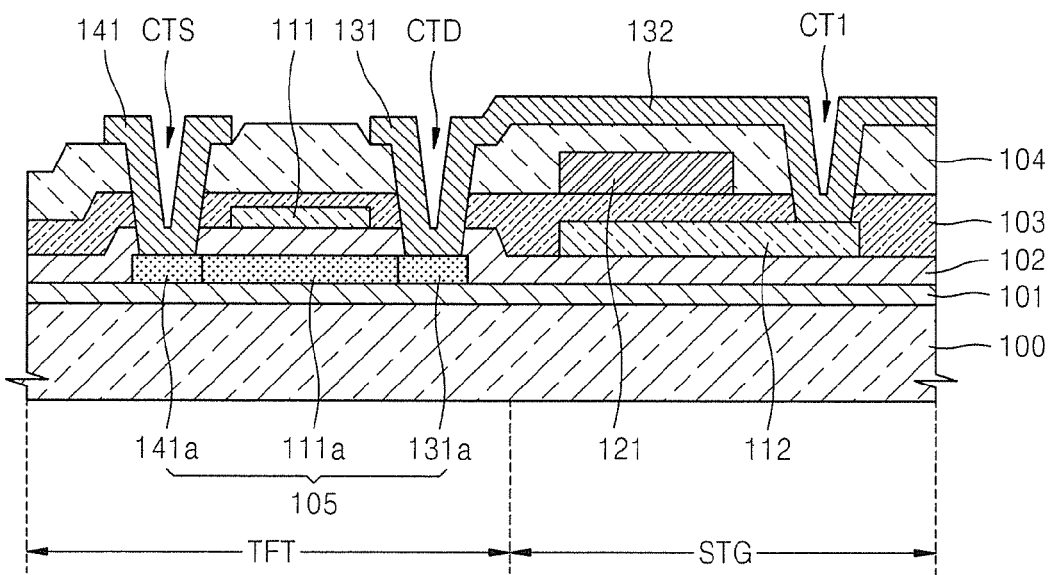

Referring to FIG. 9, the source electrode 141 and the drain electrode 131 are located in the TFT area. In one embodiment of the present invention, the source electrode 141 is a part of the data line 140. Accordingly, the data line 140 is located on the substrate 100 extending in the second direction and crossing with the gate line 110 extending in the first direction. Also, according to an embodiment of the present invention, the drain electrode 131 extends into the STG area so as to form the third storage electrode 132. Referring to FIG. 9, the source electrode 141 and the drain electrode 131 contact the active layer 105 through the CTS and the CTD, respectively. Also, the third storage electrode 132 contacts the first storage electrode 112 through the first contact hole CT1.

Figure 10:
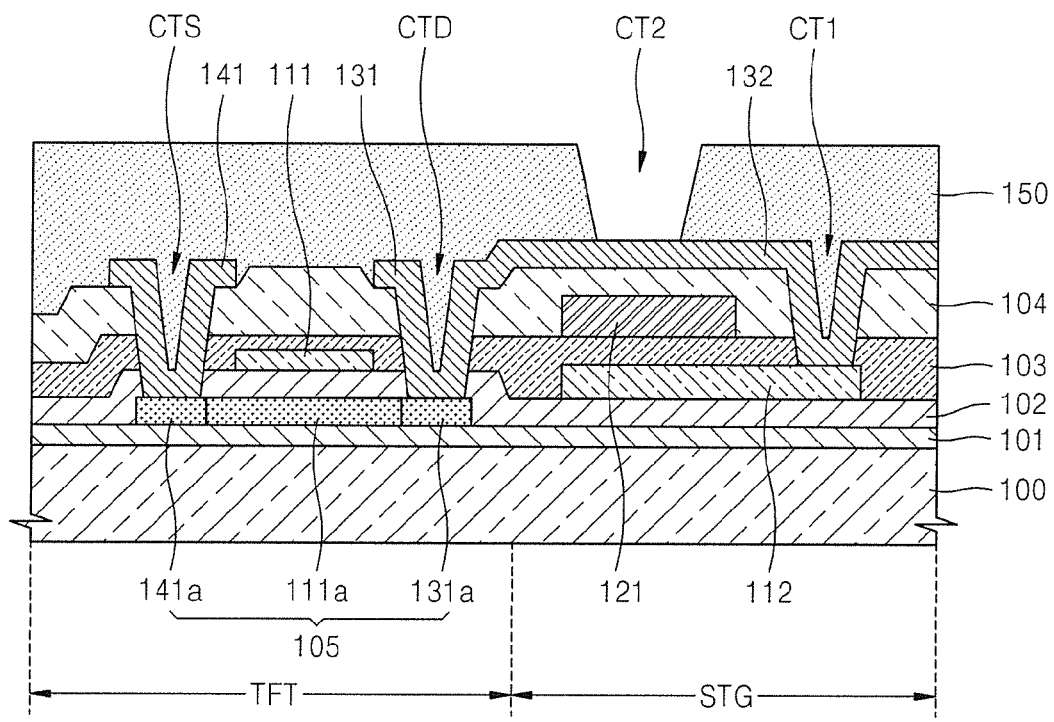

Referring to FIG. 10, the protection layer 150 covers the source electrode 141, the drain electrode 131, and the third storage electrode 132. Also, the second contact hole CT2 is located in the protection layer 150 to correspond to a part (or location) where the third storage electrode 132 or the first storage electrode 112 is located. In particular, the second contact hole CT2 may be located to correspond to a part (or location) where the second storage electrode 121 is located, which may increase an aperture ratio of the pixel.

Figure 11:
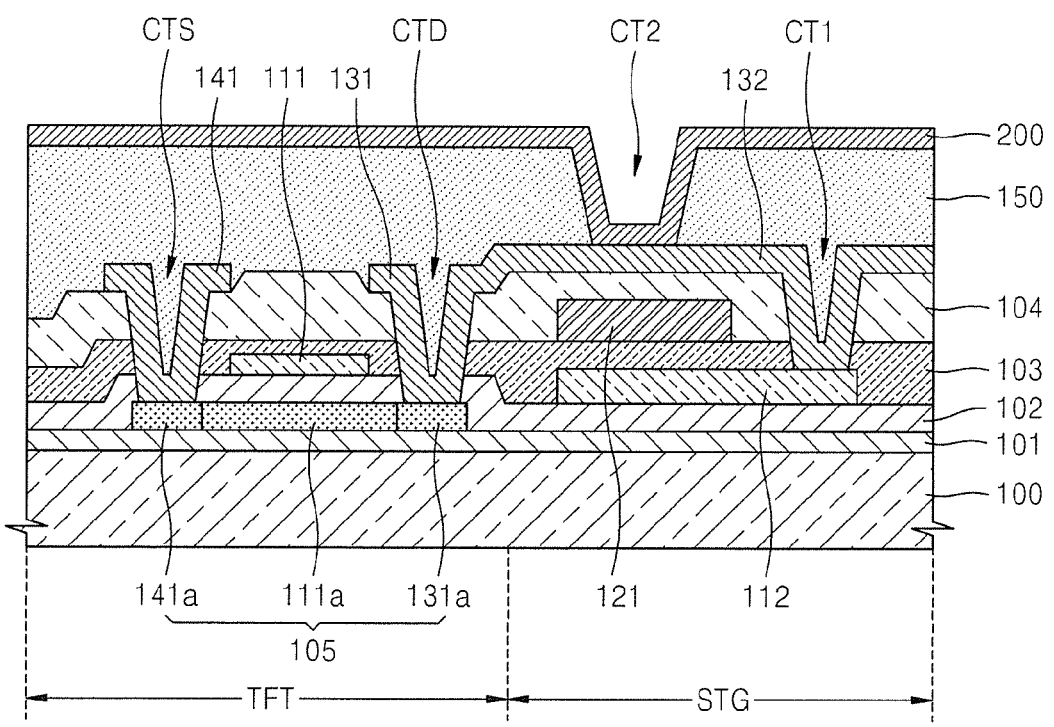

Referring to FIG. 11, the pixel electrode 200 is located to cover the protection layer 150. The pixel electrode 200 may be formed of ITO having a high work function, indium zinc oxide (IZO), zinc oxide (ZnO), or indium oxide ($In_2O_3$). However, a material used to form the pixel electrode 200 is not limited to the above examples and the pixel electrode 200 may be formed of a conductive organic material or a conductive paste including conductive particles such as Ag, Mg, and Cu. If the conductive paste is used to form the pixel electrode 200, the pixel electrode 200 may be printed by using an inkjet printing method and may then be plasticized to prepare an electrode.

Figure 12:
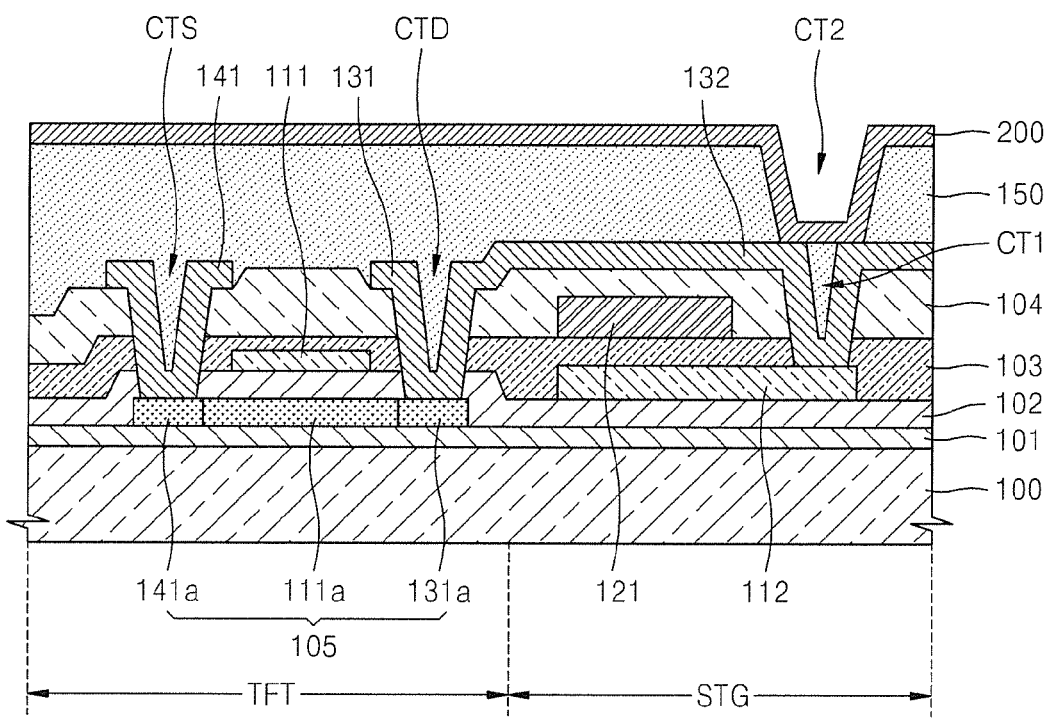
FIGS. 12 through 14 are cross-sectional views illustrating flat panel display devices according to embodiments of the present invention.
Figure 13:
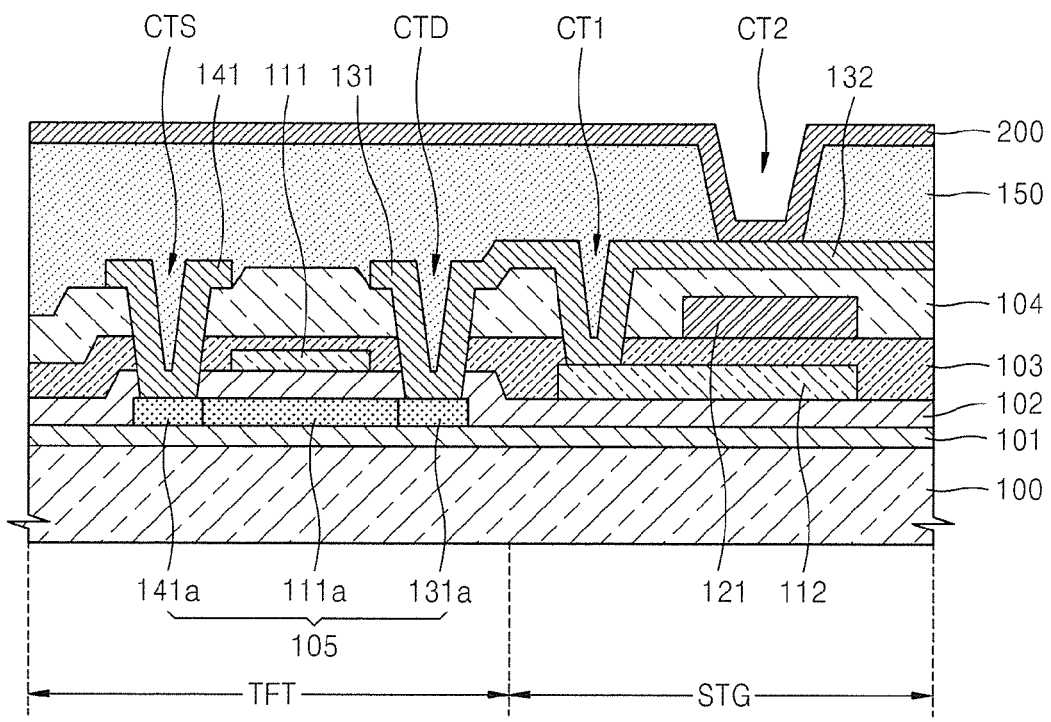
Figure 14:
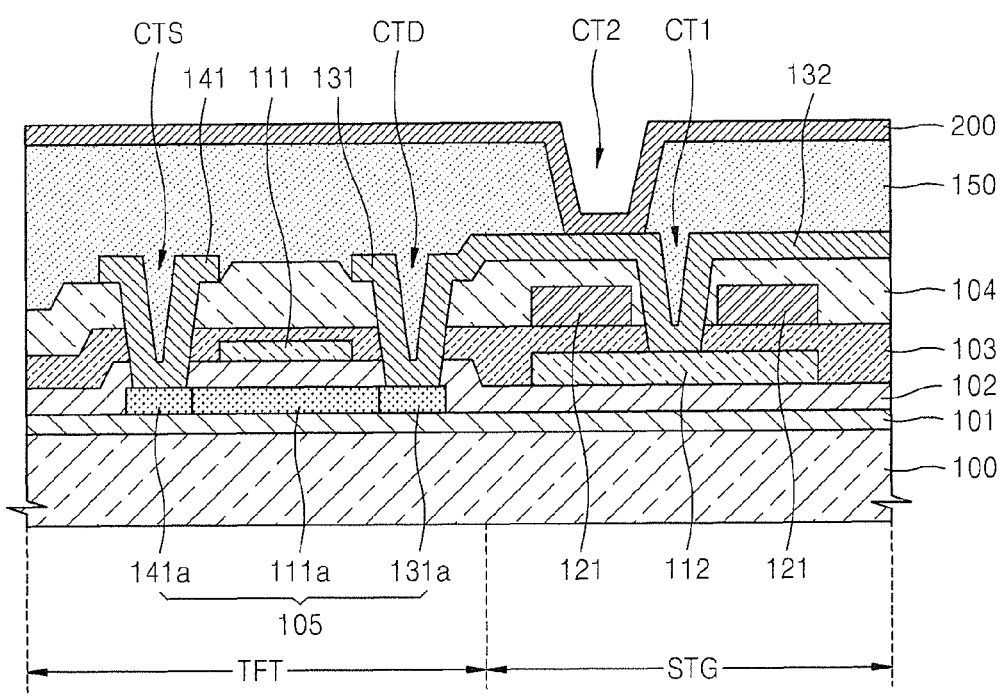

FIGS. 12 through 14 are cross-sectional views illustrating a method of manufacturing a flat panel display device, according to other embodiments of the present invention.

Referring to FIG. 12, in one embodiment of the present invention, unlike FIG. 11 where the first contact hole CT1 and the second contact hole CT2 do not overlap each other, the first contact hole CT1 and the second contact hole CT2 may overlap each other.

Referring to FIG. 13, in one embodiment of the present invention, the first contact hole CT1 is disposed at a left side of the second storage electrode 121, whereas the first contact hole CT1 is disposed at a right side of the second storage electrode 121 in FIG. 11. The first contact hole CT1 is located to correspond to a part where the second storage electrode 121 is not located.

Referring to FIG. 14, in one embodiment of the present invention, the second storage electrode 121 is divided and the first contact hole CT1 is disposed between the divided second storage electrodes 121. In this case, at least two second storage electrodes 121 may be formed and in a plan view, a hole may be located in the center of the second storage electrode 121.

Accordingly, the locations of the first and second contact holes CT1 and CT2 and arrangement, number, and form of the storage electrodes may not be limited to the description above and may vary within the scope of the invention which may be modified by one of ordinary skill in the art.

According to embodiments of the present invention, the storage capacitors are arranged in parallel and thus capacitance thereof increases. Also, when maintaining the same capacitance, if the storage capacitors according to the embodiments of the present invention are used instead of a typical capacitor, dimensions decrease and thus an aperture ratio increases.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A flat panel display device comprising:
a plurality of pixel areas, each located at a crossing region of a gate line, a data line, and a common voltage line;
a thin film transistor (TFT) located at a region where the gate line and the data line cross each other, the TFT comprising an active layer, a gate electrode, a source electrode, and a drain electrode; and
a storage capacitor located at a region where the common voltage line and the drain electrode cross each other, the storage capacitor comprising a first storage electrode, a second storage electrode, and a third storage electrode, the second storage electrode being located between the first storage electrode and the third storage electrode, and the first storage electrode being in direct contact with the third storage electrode and being separated from the active layer.

2. The device of claim 1, wherein the second storage electrode comprises a metal or indium tin oxide (ITO).

3. The device of claim 1, wherein the flat panel display device is a liquid crystal display device.

4. A flat panel display device comprising:
a plurality of pixel areas, each located at a crossing region of a gate line, a data line, and a common voltage line;
a thin film transistor (TFT) located at a region where the gate line and the data line cross each other, the TFT comprising a gate electrode, a source electrode, and a drain electrode; and
a storage capacitor located at a region where the common voltage line and the drain electrode cross each other, the storage capacitor comprising a first storage electrode, a second storage electrode, and a third storage electrode,
wherein the first storage electrode is located at a same level as the gate electrode, the second storage electrode extends from the common voltage line and partially overlaps the first storage electrode, and the third storage electrode extends from the drain electrode and overlaps the first storage electrode and the second storage electrode.

5. A flat panel display device comprising:
a plurality of pixel areas, each located at a crossing region of a gate line, a data line, and a common voltage line;
a thin film transistor (TFT) located at a region where the gate line and the data line cross each other, the TFT comprising a gate electrode, a source electrode, and a drain electrode; and
a storage capacitor located at a region where the common voltage line and the drain electrode cross each other, the storage capacitor comprising a first storage electrode, a second storage electrode, and a third storage electrode,
wherein the TFT further comprises:
an active layer located on a substrate;
an insulating layer located on the active layer; and
a plurality of interlayer adjusting layers located on the gate electrode,
wherein the gate electrode is located on the insulating layer,
wherein the source electrode is integrally formed with the data line and the source electrode contacts the active layer through a hole in the interlayer adjusting layers and the insulating layer, and
wherein the third storage electrode contacts the active layer through a hole in the interlayer adjusting layers and the insulating layer.

6. A flat panel display device comprising:
a plurality of pixel areas, each located at a crossing region of a gate line, a data line, and a common voltage line;
a thin film transistor (TFT) located at a region where the gate line and the data line cross each other, the TFT comprising a gate electrode, a source electrode, and a drain electrode; and
a storage capacitor located at a region where the common voltage line and the drain electrode cross each other, the storage capacitor comprising a first storage electrode, a second storage electrode, and a third storage electrode,
wherein the storage capacitor further comprises:
an insulating layer located on a substrate;
a first interlayer adjusting layer located on the first storage electrode; and
a second interlayer adjusting layer located on the second storage electrode,
wherein the first storage electrode is located on the insulating layer,
wherein the second storage electrode is located on the first interlayer adjusting layer and extends from the common voltage line, and
wherein the third storage electrode is located on the second interlayer adjusting layer, contacts the first storage electrode through the first interlayer adjusting layer and the second interlayer adjusting layer, and extends from the drain electrode.

7. The device of claim 6, wherein the second storage electrode comprises a plurality of second storage electrodes.

8. The device of claim 6, further comprising:
a protection layer located on the third storage electrode; and a pixel electrode located on the protection layer and contacting the third storage electrode by penetrating the protection layer.

9. The device of claim 8, further comprising:
a first contact hole to expose the first storage electrode through the first interlayer adjusting layer and the second interlayer adjusting layer at a region where the second storage electrode is not located; and
a second contact hole to expose the third storage electrode through the protection layer at a region where the first storage electrode or the third storage electrode is located.

10. The device of claim 9, wherein the first contact hole and the second contact hole overlap each other.

11. The device of claim 6, wherein the first interlayer adjusting layer and the second interlayer adjusting layer comprise at least one selected from the group consisting of silicon nitride and silicon oxide.

12. The device of claim 6, wherein the second interlayer adjusting layer comprises a material having higher permittivity than that of the first interlayer adjusting layer.

13. The device of claim 6, wherein the second interlayer adjusting layer comprises silicon nitride.

* * * * *